United States Patent
Kang

(10) Patent No.: US 8,048,744 B2
(45) Date of Patent: Nov. 1, 2011

(54) SEMICONDUCTOR DEVICE AND FABRICATING METHOD THEREOF

(75) Inventor: Dong Woo Kang, Incheon (KR)

(73) Assignee: Dongbu HiTek Co., Ltd., Seoul (KR)

( * ) Notice: Subject to any disclaimer, the term of this patent is extended or adjusted under 35 U.S.C. 154(b) by 80 days.

(21) Appl. No.: 12/626,811

(22) Filed: Nov. 27, 2009

(65) Prior Publication Data

US 2010/0148278 A1    Jun. 17, 2010

(30) Foreign Application Priority Data

Dec. 12, 2008    (KR) .................. 10-2008-0126485

(51) Int. Cl.
*H01L 21/8234*    (2006.01)
(52) U.S. Cl. ................. 438/275; 438/588; 257/E27.064
(58) Field of Classification Search .................. 438/275, 438/588; 257/392, E27.064
See application file for complete search history.

(56) References Cited

U.S. PATENT DOCUMENTS

| 6,033,944 A * | 3/2000 | Shida ............................. 438/199 |
| 6,600,212 B2 * | 7/2003 | Takayanagi et al. .......... 257/616 |
| 2006/0211200 A1 * | 9/2006 | Tomita .......................... 438/257 |
| 2008/0160704 A1 * | 7/2008 | Jang .............................. 438/276 |

* cited by examiner

*Primary Examiner* — Michael Lebentritt
*Assistant Examiner* — Daniel Whalen
(74) *Attorney, Agent, or Firm* — The Law Offices of Andrew D. Fortney; Andrew D. Fortney

(57) ABSTRACT

A semiconductor device and fabricating method thereof are disclosed. The method includes forming a polysilicon layer on a semiconductor substrate including a high-voltage area and a low-voltage area, partially etching the polysilicon layer in the low-voltage area, forming an anti-reflective layer on the polysilicon layer to reduce a step difference between the high-voltage and low-voltage areas, forming a photoresist pattern in the high-voltage and low-voltage areas, and forming a high-voltage gate and a low-voltage gate by etching the polysilicon layer using the photoresist pattern as an etch mask.

20 Claims, 2 Drawing Sheets

SEMICONDUCTOR DEVICE AND FABRICATING METHOD THEREOF

CROSS REFERENCE TO RELATED APPLICATION

This application claims the benefit of the Korean Patent Application No. 10-2008-0126485, filed on 12 Dec. 2008, which is hereby incorporated by reference as if fully set forth herein.

BACKGROUND OF THE DISCLOSURE

1. Field of the Disclosure

The present invention relates to a semiconductor device, and more particularly, to a dual gate in a semiconductor device and fabricating method thereof.

2. Discussion of the Related Art

Generally, a technology for implementing a device having different transconductances on a chip simultaneously has been proposed. This technology is applied by implementing a low-voltage drive device and a high-voltage drive device.

In implementing a low-voltage drive device and a high-voltage drive device simultaneously, a dual gate oxidation process is applied in a manner that a gate forming process is generally performed twice to form a thick high-voltage gate poly and a thin low-voltage gate poly.

This gate forming method includes sequentially forming a low-voltage gate and a high-voltage gate by performing a high-voltage gate poly process, an etching process, and a low-voltage gate poly process in order.

Thus, in a gate forming method according to a related art, a high-voltage gate and a low-voltage gate are separately formed, whereby this process is relatively complicated. Moreover, a surface tension of water is generated along a wafer surface, and more particularly, along a pattern profile of a boundary between a low-voltage device area LV and a high-voltage device area HV, whereby a water mark can be formed thereof.

Therefore, this process may be less than ideal in aspects of mass production and cost.

SUMMARY OF THE DISCLOSURE

Accordingly, the present invention is directed to a semiconductor device and fabricating method thereof that substantially obviate one or more problems due to limitations and disadvantages of the related art.

Embodiments of the present invention provide a semiconductor device and fabricating method thereof, by which a process can be simplified in a manner that a high-voltage gate and a low-voltage gate are simultaneously formed, wherein both high-voltage and low-voltage gates comprise a polysilicon layer.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of fabricating a dual gate in a semiconductor device according to the present invention can include the steps of forming a polysilicon layer on a semiconductor substrate including a high-voltage area and a low-voltage area, partially etching the polysilicon layer in the low-voltage area, forming an anti-reflective layer on the polysilicon layer to reduce a step difference between the high-voltage and low-voltage areas, forming a photoresist pattern in the high-voltage and low-voltage areas, and forming a high-voltage gate and a low-voltage gate by etching the polysilicon layer using the photoresist pattern as an etch mask.

In another aspect of the present invention, a dual gate in a semiconductor device can include a silicon substrate including a high-voltage area and a low-voltage area, a high-voltage gate in the high-voltage region, and a low-voltage gate in the low-voltage area, the low-voltage gate having a thickness smaller than the high-voltage gate.

Accordingly, the present invention provides the following effects and/or advantages.

First of all, the present invention can simplify a process in a manner that a high-voltage gate and a low-voltage gate are simultaneously formed. In addition, the present invention can reduce a cost in product production.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle(s) of the disclosure. In the drawings.

DETAILED DESCRIPTION

Reference will now be made in detail to embodiments of the present invention, examples of which are illustrated in the accompanying drawings. Wherever possible, the same reference numbers will be used throughout the drawings to refer to the same or like parts.

First of all, a dual gate semiconductor device according to embodiments of the present invention is explained with reference to FIG. 1D as follows.

Figure 1A:
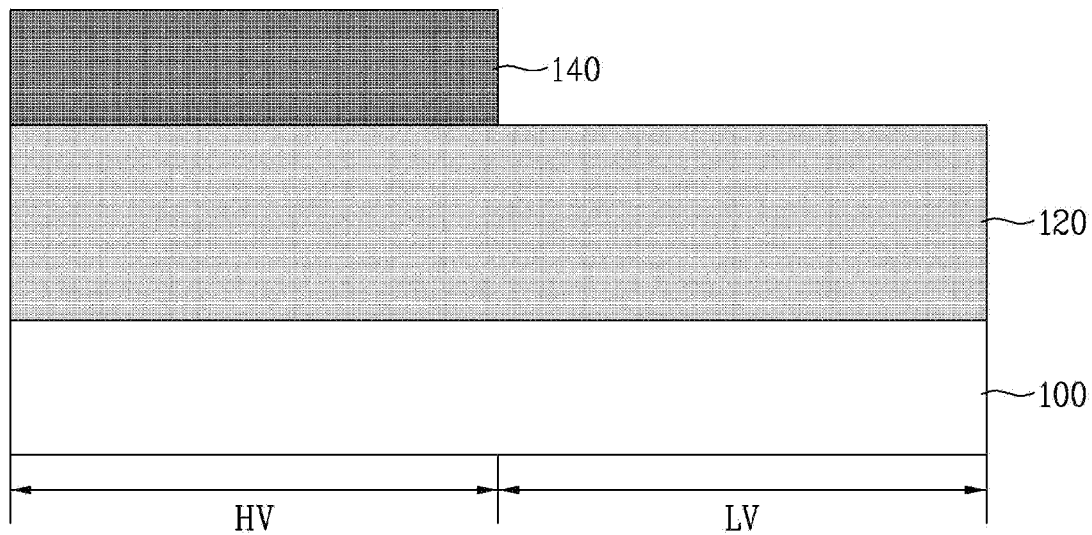
FIGS. 1A to 1D are cross-sectional diagrams of a process for forming a dual gate of a semiconductor device according to various embodiments of the present invention.
Figure 1B:
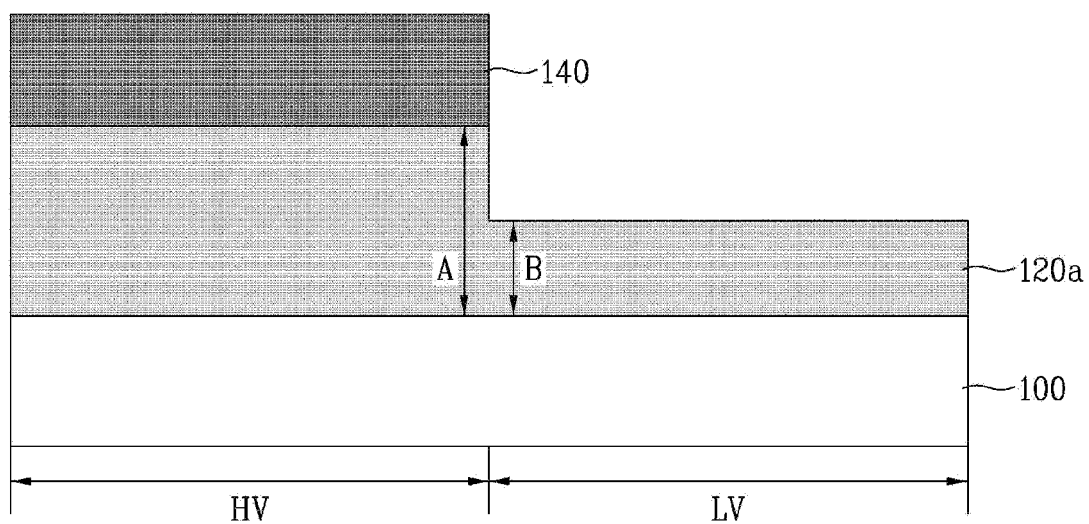
Figure 1C:
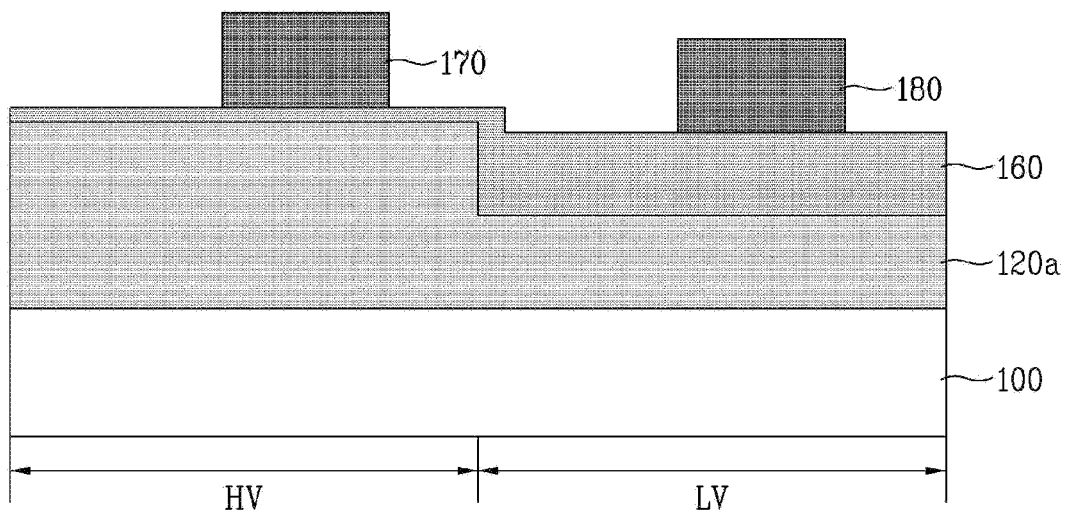
Figure 1D:
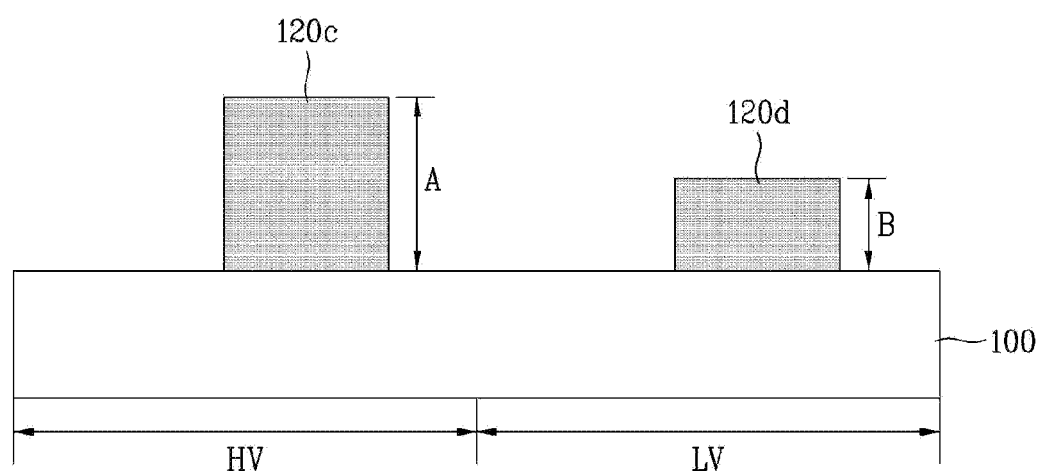

Referring to FIG. 1D, a semiconductor device includes a high-voltage gate 120c and a low-voltage gate 120d, both gates comprise a polysilicon layer which are on a silicon substrate 100 having a high voltage area HV and a low-voltage area LV.

In this case, a device isolation layer (not shown in the drawing) can be further provided between the high-voltage area HV and the low-voltage area LV.

The high-voltage gate 120c is thicker than the low-voltage gate 120d, and has a resistance greater than that of the low-voltage gate 120d.

A threshold voltage difference for forming a channel is generated from the resistance difference between the high-voltage gate 120c and the low-voltage gate 120d. As electric current flows between a drain and a source (not shown) in the substrate adjacent to the gate, through the channel under the gate, a high-voltage transistor and a low-voltage transistor can be implemented.

In the following description, a method of fabricating a dual gate in a semiconductor device according to embodiments of the present invention is explained with reference to FIGS. 1A to 1D.

FIGS. 1A to 1D are cross-sectional diagrams of structures in a process for forming a dual gate of a semiconductor device according to embodiments of the present invention.

Referring to FIG. 1A, a silicon substrate 100 having high-voltage and low-voltage areas HV and LV defined thereon is provided.

In this case, a high-voltage gate will be formed in the high-voltage area HV and a low-voltage gate relatively thinner than the high-voltage gate will be formed in the low-voltage area LV.

Prior to formation of the high-voltage and low-voltage gates, a device isolation layer (not shown in the drawing) can be formed between the high-voltage and low-voltage areas HV and LV of the silicon substrate 100 by STI (shallow trench isolation).

Also, an N-well or P-well (not shown in the drawing) is formed in each of the high-voltage and low-voltage areas HV and LV by ion implantation with N or P type impurities.

A polysilicon layer 120 is then formed over the silicon substrate 100.

In this case, first, a gate oxide layer (not shown) is formed by wet oxidation of the substrate 100 at a temperature of about 800° C.-1000° C. (e.g., about 800° C.). The gate oxide layer generally has a greater thickness (e.g., by 10-50 Å, or by 20-100%) in the high voltage region than in the low voltage region, and in grown in a three-step process (growth of a first thermal oxide, etching of the oxide in the LV region while masking the oxide in the HV region, and growth of a second thermal oxide). The polysilicon layer 120 is then blanket-deposited (e.g., by chemical vapor deposition using a plasma into which a silicon source gas such as silane or disilane is introduced) onto the gate oxide layer.

In particular, the polysilicon layer 120 is formed to the thickness of a high-voltage gate in both the high-voltage and low-voltage areas HV and LV.

Photoresist is coated over the semiconductor substrate 100 and photolithography is then performed on the photoresist using a photo mask. Therefore, a first photoresist pattern 140 is formed in the high-voltage area HV, while the polysilicon layer 120 in the low-voltage area LV is externally exposed.

Referring to FIG. 1B, the polysilicon layer 120a in the low-voltage area LV is etched to a depth A-B by performing an etch process using the first photoresist pattern 140 as an etch mask. Generally, "A" is the thickness of the polysilicon layer 120 in the high-voltage area HV, and "B" is the target thickness of the polysilicon layer 120a in the low-voltage area LV.

In this case, the etch process can include a dry etch process for a predetermined or target time, using an empirically determined etch rate to determine the etch time.

In particular, the target etch depth A-B of the polysilicon layer of the dry etch can be controlled by a timed etch using an etch rate of the etching equipment.

After completion of the etch, a portion of the polysilicon layer 120a remaining in the low-voltage area LV has a sufficient thickness B to form a low-voltage transistor gate.

Meanwhile, the thicknesses A and B of the polysilicon layer are adjustable, and target thicknesses can be set according to the voltages for operating high-voltage and low-voltage devices, respectively.

Referring to FIG. 1C, the first photoresist pattern 140 remaining in the high-voltage area HV is removed by a wet cleaning process.

Subsequently, a step difference between the high-voltage and low-voltage areas HV and LV is reduced by an anti-reflective layer (BARC) forming process.

In particular, an anti-reflective layer 160 is coated on the silicon substrate 100 including the high-voltage and low-voltage areas HV and LV. The anti-reflective layer 160 may comprise a conventional bottom anti-reflective coating (BARC), or a conventional organic or inorganic anti-reflective layer (e.g., silicon oxide, silicon nitride, or silicon oxynitride). This silicon substrate 100 is loaded in a heating device, e.g., an oven or a hot plate. The temperature of the oven or hot plate is controlled at 100~400° C. to transfer heat to the anti-reflective layer 160.

Preferably, the step difference amounting to a difference A-B is eliminated, especially in the case of an organic anti-reflective layer (e.g., a hydrocarbon-based polymer with a carboxylate or sulfonyl group therein).

After completion of the anti-reflective layer 160, a process for forming a gate pattern for high-voltage and low-voltage gates is performed.

In particular, a second photoresist pattern 170 and 180 are formed on the anti-reflective layer 160 in the high-voltage and low-voltage areas HV and LV, respectively. The anti-reflective layer 160 and the polysilicon layer 120a are then dry-etched using the second photoresist pattern 170, 180 as an etch mask.

Thus, a high-voltage gate 120c and a low-voltage gate 120d are formed by performing one etch process after completion of the second photoresist pattern 170, 180. Therefore, an overall process can be simplified.

Referring to FIG. 1D, after the high-voltage gate 120c and the low-voltage gate 120d have been formed in the high-voltage area HV and the low-voltage area LV, respectively, the second photoresist pattern 170, 180 and the anti-reflective layer 160 are removed.

As mentioned in the foregoing description, if the gate of the high-voltage transistor differs from that of the low-voltage transistor in thickness, a threshold voltage difference for forming a channel is generated from the resistance difference of the polysilicon layer, by which high- and low-voltage transistors can be implemented.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of fabricating a semiconductor device, comprising:
    forming a polysilicon layer on a semiconductor substrate including a high-voltage area and a low-voltage area;
    partially etching the polysilicon layer in the low-voltage area;
    forming an anti-reflective layer on the partially etched polysilicon layer to reduce a step difference between the high-voltage and low-voltage areas;
    forming a first photoresist pattern in the high-voltage and low-voltage areas, respectively; and
    forming a high-voltage gate and a low-voltage gate by etching the partially etched polysilicon layer using the first photoresist pattern as an etch mask.

2. The method of claim 1, wherein the polysilicon layer in the low-voltage area has a smaller thickness than the polysilicon layer in the high-voltage area.

3. The method of claim 2, wherein partially etching the polysilicon layer in the low-voltage area comprises dry etching for a predetermined or target time.

4. The method of claim 1, wherein forming the anti-reflective layer comprises coating an anti-reflective material on the polysilicon layer in the high-voltage and low-voltage areas.

5. The method of claim 4, further comprising heating the anti-reflective material using an oven or a hot plate at a temperature of about 100-400° C.

6. The method of claim 1, further comprising forming a device isolation layer by shallow trench isolation between the high-voltage area and the low-voltage area.

7. The method of claim 1, further comprising forming an n-well in each of the high-voltage and low-voltage areas by ion implantation of N-type impurities.

8. The method of claim 1, wherein forming the polysilicon layer comprises chemical vapor deposition using a plasma into which a silicon source gas is introduced.

9. The method of claim 1, further comprising, prior to partially etching the polysilicon layer in the low-voltage area, forming a second photoresist pattern in the high-voltage area, exposing a surface of the low-voltage area.

10. The method of claim 1, wherein the polysilicon layer comprises a first portion in the high-voltage area and a second portion in the low-voltage area, the first portion being thicker than the second portion.

11. The method of claim 10, wherein the first and second portions have a thickness corresponding to operating voltages for the high-voltage and low-voltage devices.

12. The method of claim 10, wherein the step difference of the portions of the polysilicon layer between the high-voltage and low-voltage are reduced and/or eliminated by the anti-reflective layer.

13. The method of claim 1, further comprising forming a gate oxide layer on the semiconductor substrate by a wet oxidation process conducted at a temperature of about 800-1000° C.

14. The method of claim 13, wherein said gate oxide layer generally has a thickness in the high voltage region 20 to 100 percent greater than in the low voltage region.

15. The method of claim 1, wherein the anti-reflective layer comprises an inorganic anti-reflective layer.

16. The method of claim 15, wherein the inorganic anti-reflective layer comprises silicon oxide, silicon nitride, or silicon oxynitride.

17. The method of claim 1, wherein the anti-reflective layer comprises an organic anti-reflective layer.

18. The method of claim 17, wherein the organic anti-reflective layer comprises a hydrocarbon-based polymer with a carboxylate or sulfonyl group.

19. The method of claim 1, further comprising forming an p-well in each of the high-voltage and low-voltage areas by ion implantation of P-type impurities.

20. The method of claim 1, wherein partially etching the polysilicon layer comprises dry etching the polysilicon layer for a predetermined or target time, using an empirically determined etch rate to determine the predetermined or target time.

* * * * *